(12) United States Patent
Das et al.

(10) Patent No.: US 10,382,027 B2
(45) Date of Patent: Aug. 13, 2019

(54) TRANSITION DETECTION CIRCUITRY AND METHOD OF DETECTING A TRANSITION OF A SIGNAL OCCURRING WITHIN A TIMING WINDOW

(71) Applicant: ARM LIMITED, Cambridge (GB)

(72) Inventors: Shidhartha Das, Upper Cambourne (GB); David Michael Bull, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/568,174

(22) PCT Filed: Mar. 3, 2016

(86) PCT No.: PCT/GB2016/050561
§ 371 (c)(1),
(2) Date: Oct. 20, 2017

(87) PCT Pub. No.: WO2016/174384
PCT Pub. Date: Nov. 3, 2016

(65) Prior Publication Data
US 2018/0138900 A1 May 17, 2018

(30) Foreign Application Priority Data
Apr. 28, 2015 (GB) .................................. 1507216.8

(51) Int. Cl.
*H03K 5/1534* (2006.01)
*H03K 3/037* (2006.01)

(52) U.S. Cl.
CPC ........... *H03K 5/1534* (2013.01); *H03K 3/037* (2013.01); *H03K 3/0375* (2013.01)

(58) Field of Classification Search
CPC .................................................. H03K 5/1534
See application file for complete search history.

(56) References Cited

U.S. PATENT DOCUMENTS 7,782,093 B2 * 8/2010 Dray ..................... G11C 7/22
327/24
8,471,612 B1 * 6/2013 Bull ..................... H03K 3/0375
327/147

(Continued)

OTHER PUBLICATIONS

International Search Report and Written Opinion of the ISA for PCT/GB2016/050561, dated May 20, 2016, 20 pages.

(Continued)

*Primary Examiner* — Hai L Nguyen
(74) *Attorney, Agent, or Firm* — Nixon & Vanderhye P.C.

(57) ABSTRACT

A transition detection circuit and method of operation of such a circuit are provided, the transition detection circuit having pulse generation circuitry to receive an input signal and to generate a pulse signal in response to a transition in the input signal, and pulse detection circuitry to assert an error signal on detection of the pulse signal generated by the pulse generation circuitry. The pulse generation circuitry has pulse control circuitry to control a property of the pulse signal dependent on a timing window indication signal. In particular, when the pulse signal is generated at least partly while the timing window indication signal is set, the pulse control circuitry controls the property of the pulse signal such that generated pulse signal is detected by the pulse detection circuitry. In contrast, when the pulse signal is entirely generated while the timing window indication signal is cleared, the pulse control circuitry controls the property of the pulse signal such that the generated pulse signal is undetected by the pulse detection circuitry. This gives rise to significant area and energy consumption savings, while still allowing reliable detection of timing errors.

16 Claims, 13 Drawing Sheets

(56) References Cited

U.S. PATENT DOCUMENTS

| | | |
|---|---|---|
| 9,444,440 B2* | 9/2016 | Jain .................. H03K 19/00346 |
| 2007/0162798 A1 | 7/2007 | Das et al. |
| 2014/0122947 A1 | 5/2014 | Bowman et al. |
| 2014/0152344 A1 | 6/2014 | Chiou et al. |

OTHER PUBLICATIONS

Combined Search and Examination Report for GB1507216.8, dated Jun. 25, 2015, 5 pages.
Examination Report dated Jul. 20, 2018 in GB Application No. 1507216.8, 4 pages.

* cited by examiner

FIG. 2 (REFERENCE IMPLEMENTATION - NOT AN EMBODIMENT)

|  | FIG. 2 | FIG. 4 | %SAVING (DELTA/ORIG) |
|---|---|---|---|
| Transistor Width in Pulse-generators | 11.18um | 5.70um | 49% |
| Transistor Width on CK | 1.45um | 0.5um | 65% |
| Energy in 1 cycle when data switches | 13.2fj | 7.2fj | 45.4% |
| Energy in 1 cycle when data is static | 2.13fj | 0.5fj | 76.5% |

Simulations performed at 1.2V/TT/25C conditions for TSMC 65LP for an error-free transition (No layout parasitics)

FIG. 6

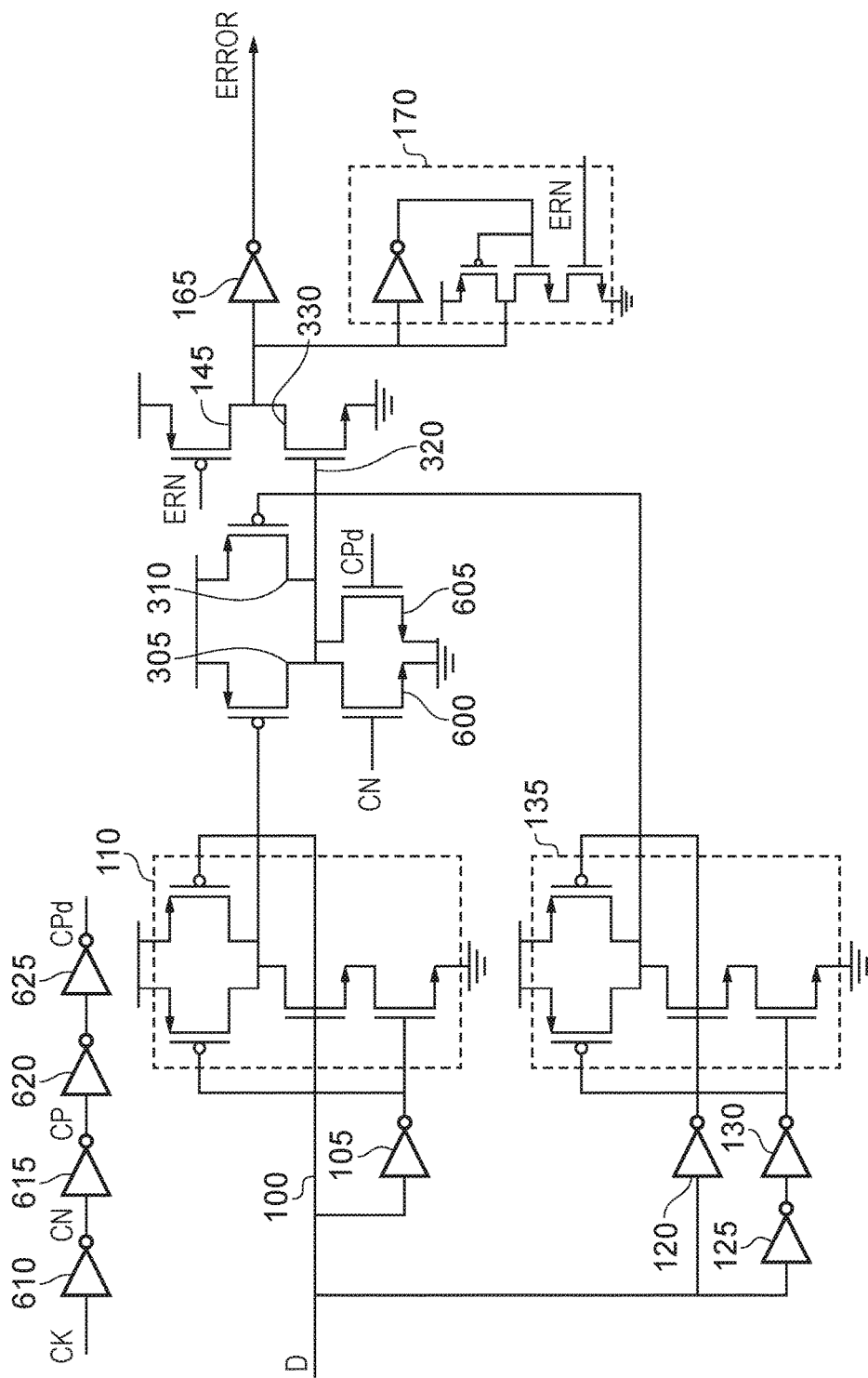
FIG. 9A (ALTERNATIVE TO FIG 4 WHEN TIMING WINDOW INDICATION INFERRED FROM CLOCK)

(ALTERNATIVE TO FIG 7 WHEN TIMING WINDOW INDICATION INFERRED FROM CLOCK)

# TRANSITION DETECTION CIRCUITRY AND METHOD OF DETECTING A TRANSITION OF A SIGNAL OCCURRING WITHIN A TIMING WINDOW

This application is the U.S. national phase of International Application No. PCT/GB2016/050561 filed 3 Mar. 2016, which designated the U.S. and claims priority to GB Patent Application No. 1507216.8 filed 28 Apr. 2015, the entire contents of each of which are hereby incorporated by reference.

BACKGROUND

The present technique relates to transition detection circuitry, and to a method of detecting a transition of a signal occurring within a timing window.

Transition detection circuits can be used for a variety of reasons within modern data processing systems. A transition detection circuit is used to detect a transition in an input signal to the transition detection circuit that occurs within a predetermined timing window, and in the event of detecting such a transition the transition detection circuit typically issues an error signal. The transition detection circuit may be arranged to detect a rising edge transition (a logic zero to logic one level transition), a falling edge transition (a logic one to logic zero level transition), or both.

It is known to employ margining methods during the timing analysis and sign off of a data processing system design in order to account for variations such as process, voltage and temperature (PVT) variations. However, whilst such margining methods make the data processing system design robust against timing failures, they can have a significant impact on performance and energy consumption. Accordingly, there has been much interest in developing adaptive techniques that seek to eliminate a significant portion of safety margins by dynamically adjusting system parameters such as supply voltage, body bias and operating frequency to account for variation in environmental conditions and silicon grade.

To seek to eliminate worst-case safety margins, ARM Limited developed a voltage and frequency management technique for Dynamic Voltage and Frequency Scaled (DVFS) processors, based on in-situ error detection and correction, called Razor. The in-situ error detection circuitry within Razor can be arranged to use the earlier-mentioned transition detection circuitry in order to identify when data signals are transitioning too close to a clock edge identified by the timing window, indicating a timing error. In such instances, an error signal can be issued, and corrective actions can then be taken. Significant energy savings can be realised using such techniques, by removing the margins traditionally provided for PVT variations, and even by deliberating tolerating a targeted error rate, allowing for example the supply voltage to be scaled even lower to provide additional energy savings.

Transition detection circuitry can also be used in other situations. For example, such a transition detector can be used to monitor aging of a data processing system. In particular, as the device ages, certain components will operate more slowly, which may result in late transitions in signals, that can then be detected by such transition detection circuits. Such transition detection circuitry can also be used for example to detect transient event upsets, that may cause a late transition in a data signal.

Transition detection circuits typically operate by generating a pulse from a rising or falling transition in an input signal, and an error signal is then flagged when that pulse is detected within a predetermined timing window. In known transition detection circuits, the pulse generator components are suitably sized to generate a wide pulse from a transition in the input signal being monitored. A wide pulse ensures that robust error detection can be achieved even under pessimistic PVT variation conditions and when the monitored node glitches. However, the use of such wide devices incurs power (both leakage and dynamic) and area overheads within the data processing apparatus including the transition detection circuit. These overheads can limit the energy-efficiency gains achievable through adaptive technique such as Razor, and will ultimately limit the total number of signals that can be monitored using such transition detection circuitry, especially in a balanced pipeline design. In addition, the wide pulse can cause early transitions (that would in fact not be problematic) to be flagged as timing errors (this early detection of timing errors being referred to as the set-up pessimism of the transition detector).

Accordingly, it would be desirable to provide an improved transition detection circuitry that enables the above problems to be alleviated.

SUMMARY

In accordance with one example configuration, there is provided transition detection circuitry comprising: pulse generation circuitry to receive an input signal and to generate a pulse signal in response to a transition in the input signal; and pulse detection circuitry to assert an error signal on detection of the pulse signal generated by the pulse generation circuitry; the pulse generation circuitry having pulse control circuitry to control a property of the pulse signal dependent on a timing window indication signal; the pulse control circuitry being arranged, when the pulse signal is generated at least partly whilst the timing window indication signal is set, to control the property of the pulse signal such that the pulse signal generated by the pulse generation circuitry is detected by the pulse detection circuitry; and the pulse control circuitry being arranged, when the pulse signal is entirely generated whilst the timing window indication signal is cleared, to control the property of the pulse signal such that the pulse signal generated by the pulse generation circuitry is undetected by the pulse detection circuitry.

In accordance with another example configuration, there is provided a data processing apparatus comprising: processing circuitry to perform data processing operations; and transition detection circuitry in accordance with the above mentioned example configuration, arranged to receive, as an input signal, a data signal generated by the processing circuitry.

In accordance with a yet further example configuration, there is provided a method of generating an error signal indicating detection of a transition in an input signal occurring within a timing window, comprising: generating a pulse signal in response to a transition in the input signal; asserting an error signal on detection of the pulse signal; controlling a property of the pulse signal dependent on a timing window indication signal; when the pulse signal is generated at least partly whilst the timing window indication signal is set, controlling the property of the pulse signal such that the pulse signal is detected; and when the pulse signal is entirely generated whilst the timing window indication signal is cleared, controlling the property of the pulse signal such that the pulse signal is undetected.

In accordance with an additional example configuration, there is provided transition detection circuitry comprising: pulse generation means for receiving an input signal and for generating a pulse signal in response to a transition in the input signal; and pulse detection means for asserting an error signal on detection of the pulse signal generated by the pulse generation means; the pulse generation means having pulse control means for controlling a property of the pulse signal dependent on a timing window indication signal; the pulse control means, when the pulse signal is generated at least partly whilst the timing window indication signal is set, for controlling the property of the pulse signal such that the pulse signal generated by the pulse generation means is detected by the pulse detection means; and the pulse control means, when the pulse signal is entirely generated whilst the timing window indication signal is cleared, for controlling the property of the pulse signal such that the pulse signal generated by the pulse generation means is undetected by the pulse detection means.

BRIEF DESCRIPTION OF THE DRAWINGS

The present technique will be described further, by way of example only, with reference to embodiments thereof as illustrated in the accompanying drawings, in which:

FIG. 6 is a table illustrating the savings achievable when using the circuitry of FIG. 4, when compared with the reference design of FIG. 2;

FIG. 9A is a diagram of transition detection circuitry in accordance with an alternative embodiment to that discussed earlier with reference to FIG. 4;

DESCRIPTION OF EMBODIMENTS

Figure 1:
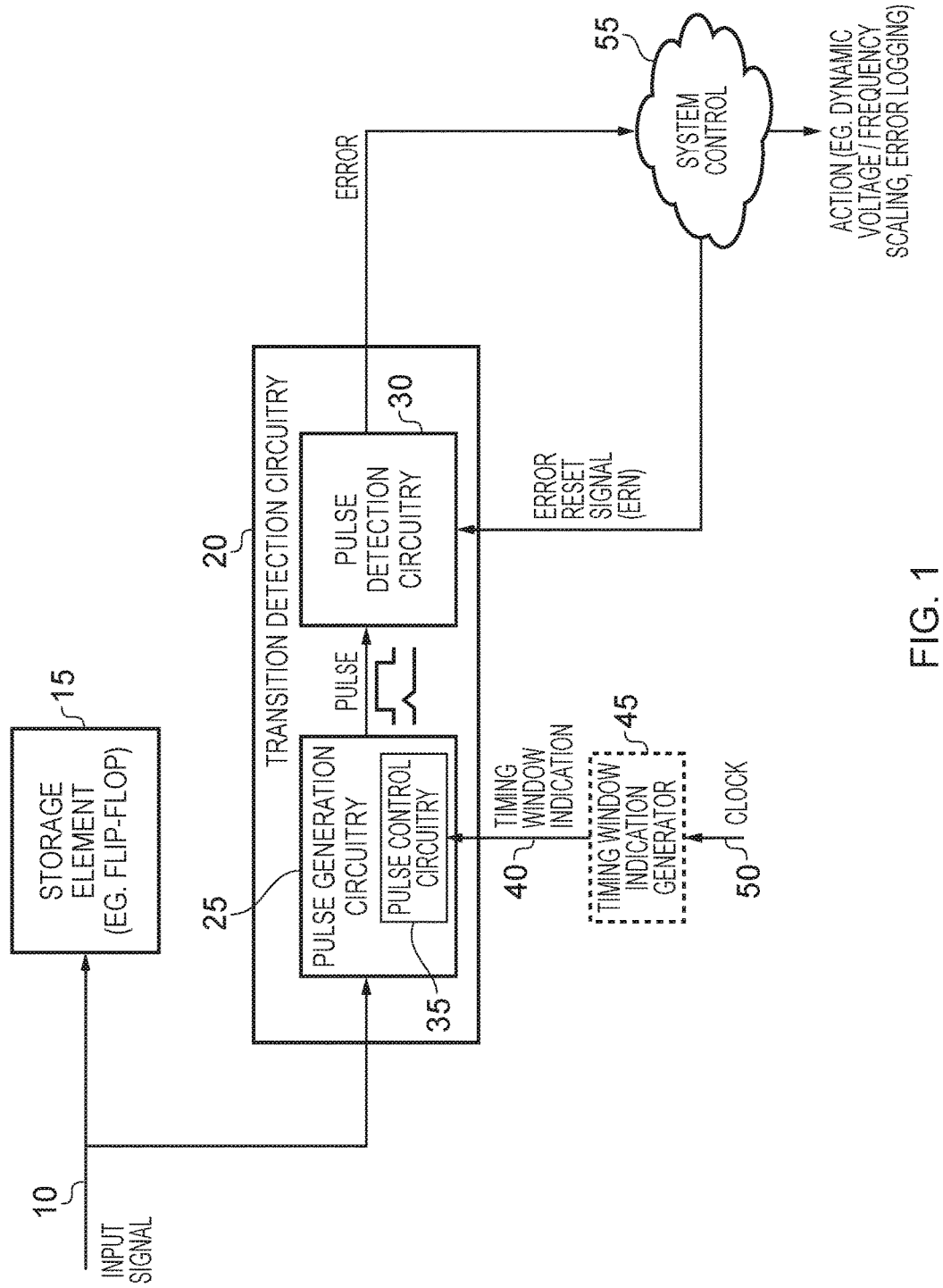
FIG. 1 is a block diagram of a data processing system including a transition detection circuit in accordance with one embodiment.

Before discussing the embodiments with reference to the accompanying figures, the following description of embodiments is provided.

In accordance with one embodiment, transition detection circuitry is provided that comprises pulse generation circuitry arranged to receive an input signal and to generate a pulse signal in response to a transition in the input signal, and pulse detection circuitry that is arranged to assert an error signal on detection of the pulse signal generated by the pulse generation circuitry. In addition, the pulse generation circuitry has pulse control circuitry that is used to control a property of the pulse signal dependent on a timing window indication signal. In particular, when the pulse signal is generated at least partly whilst the timing window indication signal is set, the pulse control circuitry controls a property of the pulse signal such that the pulse signal generated by the pulse generation circuitry is detected by the pulse detection circuitry. In contrast, when the pulse signal is entirely generated whilst the timing window indication signal is cleared (i.e. not set), the pulse control circuitry instead controls the property of the pulse signal such that the pulse signal generated by the pulse generation circuitry is undetected by the pulse detection circuitry. By such an approach, a pulse signal sufficient to be detected by the pulse detection circuitry is only generated in situations when the pulse signal is generated at least partly whilst the timing window indication signal is set. This enables a significant reduction in the area, power and timing overheads of the transition detection circuitry.

In one embodiment, the pulse signal is generated at least partly whilst the timing window indication is set if any part of the pulse signal is active during the period that the timing window indication signal is set. This may occur not only when the pulse signal begins to be asserted whilst the timing window indication signal is set, but can also occur when the pulse signal begins to be asserted very shortly before the timing window indication signal is set, and is still in the process of being generated at the time the timing window indication signal is set. At that point, the property of the pulse signal will be modified such that the pulse signal generated is detected by the pulse detection circuitry. In contrast, in one embodiment the pulse signal will be entirely generated whilst the timing window indication signal is cleared if the entire active period of the pulse signal occurs whilst the timing window indication signal is not set.

There are a number of properties of the pulse signal that could be controlled by the pulse control circuitry. For example, the pulse control circuitry could be arranged to modify the behaviour of the pulse generation circuitry dependent on whether the pulse signal is generated at least partly whilst the timing window indication signal is set or not, so that only when the pulse signal is generated at least partly whilst the timing window indication signal is set does the pulse signal reach the full logic level associated with an active pulse (for example a logic one level assuming the pulse is logic one pulse and hence the pulse output is at a logic zero level in the absence of the pulse signal). In situations when the pulse signal is instead entirely generated whilst the timing window indication signal is cleared, the pulse signal in that scenario would not reach the full logic one level, and accordingly would be undetected by the pulse detection circuitry.

However, in one embodiment the property of the pulse signal controlled by the pulse control circuitry is instead a pulse width of the pulse signal. In particular, in one embodiment, the pulse control circuitry is arranged, when the pulse signal is generated at least partly whilst the timing window indication signal is set, to control the pulse width such that the pulse signal is generated with the pulse width sufficient to cause the pulse detection circuitry to detect the pulse signal. In contrast, the pulse control circuitry is arranged, when the pulse signal is entirely generated whilst the timing window indication signal is cleared, to control the pulse width such that the pulse signal is generated with the pulse width insufficient to cause the pulse detection circuitry to detect the pulse signal.

In one embodiment, this is achieved by ensuring that the default action of the pulse generation circuitry is to generate a pulse with a width insufficient to be detected by the pulse detection circuitry. However, when the pulse signal is generated at least partly whilst the timing window indication signal is set, the pulse control circuitry modifies the behaviour of the pulse generation circuitry so that the width of the pulse signal generated is extended so as to then be of a pulse width sufficient to be detected by the pulse detection circuitry.

There are a number of ways in which this behaviour can be achieved. In one embodiment, the pulse control circuitry comprises transistor circuitry forming one of a pull-down path and a pull-up path within the pulse generation circuitry, the pulse control circuitry being turned off whilst the timing window indication signal is set.

By such an approach, a pulse signal with a relatively wide pulse width can be generated when required by discharging (in the event that the pulse control circuitry is placed in a pull-down path) or charging (in the event that the pulse control circuitry is provided in a pull-up path) the pulsed node through weak leakage currents, rather than relying on wide devices. This hence enables the size of the components within the pulse generation circuitry to be significantly reduced relative to a known pulse generation circuit whose components are sized so as to produce a wide pulse in all situations. This hence gives rise to significant energy consumption savings and area savings. In addition, the earlier mentioned problem of set-up pessimism is also alleviated, since a transition in the input signal can occur much more closely to the timing window without the pulse being detected, and hence without an error signal being generated unnecessarily.

In one embodiment, the pulse generation circuitry comprises internal pulse signal generation circuitry to generate an internal pulse signal in response to the transition in the input signal, and output circuitry to generate, in dependence on the internal pulse signal, the pulse signal output to the pulse detection circuitry. The pulse control circuitry may then be incorporated within either the internal pulse signal generation circuitry or the output circuitry.

Hence, there are a variety of options as to where the pulse control circuitry is placed within the pulse generation circuitry, whilst still achieving the benefits discussed earlier.

In one embodiment, the pulse control circuitry is incorporated within the output circuitry. In such an embodiment, the internal pulse signal is such that, when the property of the pulse signal is determined from the corresponding property of the internal pulse signal, the pulse signal generated by the pulse generation circuitry is undetected by the pulse detection circuitry. The pulse control circuitry is then responsive to the pulse signal being generated at least partly whilst the timing window indication signal is set, to modify the property of the pulse signal relative to the corresponding property of the internal pulse signal, in order to ensure that the pulse signal generated by the output circuitry is detected by the pulse detection circuitry.

Hence, in such an embodiment, the internal pulse signal generation circuitry is made up of components that are insufficiently sized to generate a pulse wide enough to be detected by the pulse detection circuitry. However, when the pulse signal is generated at least partly whilst the timing window is set, the pulse control circuitry effectively modifies how the pulse signal is generated from the corresponding internal pulse signal, and in particular modifies the property of the pulse signal relative to the corresponding property of the internal pulse signal. Considering the earlier example of pulse width, in such a situation the pulse control circuitry will ensure that the width of the pulse signal is larger than the corresponding width of the internal pulse signal, thereby enabling the pulse signal generated by the output circuitry to be detected by the pulse detection circuitry.

In one particular embodiment, the pulse signal generated by the output circuitry has a starting edge triggered by a corresponding starting edge of the internal pulse signal, and the pulse control circuitry is responsive to the pulse signal being entirely generated whilst the timing window indication signal is cleared, to trigger generation of an ending edge of the pulse signal from a corresponding ending edge of the internal pulse signal. However, the pulse control circuitry is responsive to the pulse signal being generated at least partly whilst the timing window indication signal is set, to instead trigger generation of the ending edge of the pulse signal when the timing window indication signal is no longer set. Hence, in such an embodiment, the action of the pulse control circuitry is to arrange, in situations where the pulse signal is generated at least partly whilst the timing window indication signal is set, to decouple the ending edge of the pulse signal from the corresponding ending edge of the internal pulse signal, and instead to trigger generation of the ending edge of the pulse signal when the timing window indication signal is no longer set, i.e. is cleared. Considering a situation where the pulse signal is active high, this can be achieved by using the pulse control circuitry to implement a pull-down path within the output circuitry, and then turning that pull-down path off whilst the timing window indication signal is set. As a result, the pulse signal does not transition low again when the internal pulse signal ends, but instead is retained high until the end of the timing window indication signal being set, at which point the pull-down component formed by the pulse control circuitry is re-enabled, causing the pulse signal to end.

In an alternative embodiment, the pulse control circuitry is incorporated within the internal pulse signal generation circuitry, and the output circuitry is arranged to determine the property of the pulse signal from the corresponding property of the internal pulse signal. The pulse control circuitry is responsive to the pulse signal being generated at least partly whilst the timing window indication signal is set, to modify the corresponding property of the internal pulse signal in order to ensure that the pulse signal generated by the output circuitry is detected by the pulse detection circuitry. Hence, in such an embodiment, the pulse signal is always generated from the corresponding internal pulse signal, and it is the property of the internal pulse signal that is modified by the pulse control circuitry.

Considering again the example of pulse width, in one embodiment the pulse control circuitry is responsive to the pulse signal being generated at least partly whilst the timing window indication signal is set, to increase a pulse width of the internal pulse signal relative to a default pulse width of the internal pulse signal. By increasing the pulse width of the internal pulse signal in such a situation, this will in turn increase the pulse width of the output pulse signal from the pulse generation circuitry, hence causing the pulse signal to be detected by the pulse detection circuitry.

In one such embodiment, the pulse signal generated by the output circuitry has a starting edge triggered by a corresponding starting edge of the internal pulse signal and an ending edge triggered by a corresponding ending edge of the internal pulse signal. The pulse control circuitry is responsive to the pulse signal being generated at least partly whilst the timing window indication signal is set, to defer generation of the corresponding ending edge of the internal pulse signal until the timing window indication signal is no longer set.

In one particular embodiment where the pulse signal is active high, the internal pulse signal is active low, and the pulse control circuitry can implement the pull-up path within the internal pulse signal generation circuitry, and be turned off when the timing window indication signal is set. As a result, the internal pulse signal does not end until the timing window indication signal is no longer set, at which point the pull-up components are re-enabled, causing the internal pulse signal to end, and in turn causing the pulse signal output by the pulse generation circuitry to end.

In one embodiment, the transition detection circuitry receives an input clock pulse signal. This clock pulse signal may for example also be used to control the clocking of related components within the data processing system, for example a flip flop that is sampling the input signal that is also being provided to the transition detection circuitry for evaluation. In such embodiments, the timing window indication signal can be derived directly from the clock pulse signal, the clock pulse signal effectively identifying the desired timing window.

However, in alternative embodiments the system may use standard clock signals, for example with a 50:50 duty cycle, rather than a pulse clock signal. In such situations, the transition detection circuitry may further comprise timing window indication generation circuitry to generate multiple signals from which the timing window indication signal is derived. In particular, in one embodiment, two versions of the clock signal delayed with respect to each other can be used to effectively encode the timing window, and hence provide the timing window indication.

The pulse detection circuitry can be arranged in a variety of ways, but in one embodiment the pulse detection circuitry is arranged, once the pulse signal generated by the pulse generation circuitry has been detected, to continue to assert the error signal until a reset signal is received. This ensures that the error signal is not transient, but instead is maintained until a positive decision is taken to clear the error, for example by a system controller provided elsewhere is the data processing system.

In another example embodiment, there is provided a data processing apparatus comprising processing circuitry to perform data processing operations, and transition detection circuitry as provided by one of the above described embodiments, arranged to receive, as an input signal, a data signal generated by the processing circuitry.

In one such embodiment, the data processing apparatus may further comprise control circuitry, for example the earlier mentioned system controller, that is responsive to assertion of an error signal from the transition detection circuitry, to perform a predetermined operation. That predetermined operation can take a variety of forms, for example, the system controller may perform dynamic voltage and/or frequency scaling functions dependent on the error signals generated. As another example, it may merely log the occurrence of the errors for later evaluation.

Particular embodiments will now be described with reference to the Figures.

FIG. 1 is a block diagram of a data processing system incorporating transition detection circuitry in accordance with one embodiment. The transition detection circuitry 20 is arranged to receive an input signal over path 10. That input signal can take a variety of forms, and can relate to any node that it is desired to monitor within the data processing system. However, as a particular example, the input signal may be a signal that is presented as an input to a storage element 15 such as a flip flop. A particular example would be where the storage element 15 represents a storage element at an end point of a critical path, and accordingly where it is useful to detect situations where a late transition in the input signal may occur too close to a rising edge of the clock signal used by the storage element. More generally, the transition detection circuitry is arranged to detect situations where the input signal transitions within a predetermined timing window.

The transition detection circuitry 20 includes pulse generation circuitry 25 that is arranged to generate a pulse signal in response to a transition in the input signal. The pulse generation circuitry 25 can be arranged to only generate a pulse for a rising edge of an input signal, to only generate a pulse for a falling edge of the input signal, or to generate a pulse for both a rising edge and a falling edge of the input signal. For the purposes of the following discussion, it will assumed that the pulse generation circuitry 25 generates a pulse for both rising and falling transitions.

The transition detection circuitry 20 also includes pulse detection circuitry 30 that receives the pulse generated by the pulse generation circuitry 25. On detecting the presence of the pulse, the pulse detection circuitry then asserts an error signal which is forwarded to system control circuitry 55 within the data processing system. When the error signal is asserted, this will cause the system control circuitry 55 to perform one or more predetermined actions. For example, in the earlier described Razor implementation, the system controller may perform dynamic voltage and/or frequency scaling in dependence on the error signals received. In an alternative embodiment, the system controller may merely keep a log of the errors as they are generated, for later analysis.

In one embodiment, the error signal is arranged to remain asserted until it is actively cleared by an error reset signal issued from the system controller 55 to pulse detection circuitry 30.

As discussed earlier, the transition detection circuitry 20 is seeking to detect transitions in the input signal that occur within, or shortly prior, to a predetermined timing window, and accordingly the transition detection circuitry 20 should only assert an error signal if the transition occurs in those circumstances. In one embodiment, this is achieved by providing a timing window indication signal over path 40 to the pulse generation circuitry 25, and in particular to pulse control circuitry 35 provided within the pulse generation circuitry. Dependent on the timing window indication signal, the pulse control circuitry 35 controls the operation of the pulse generation circuitry so that a property of the pulse signal is varied dependent on whether the timing window indication signal is set or cleared. In particular, if the pulse generation circuitry generates the pulse signal entirely whilst the timing window indication signal is cleared, the pulse control circuitry 35 controls the property of the pulse so that it is insufficient to be detected by the pulse detection circuitry 30. As a result, no error signal is asserted. In contrast, if the pulse signal is generated at least partly whilst the timing window indication signal is set (i.e. the time during which the pulse signal is active at least partially overlaps with the time period in which the timing window indication signal is set), then the pulse control circuitry 35 modifies the property of the pulse signal such that the pulse signal is sufficient to be detected by the pulse detection circuitry.

In one embodiment, the property that the pulse control circuitry 35 controls is the pulse width of the pulse generated by the pulse generation circuitry 25. In particular, only very narrow pulses will be generated in situations where the pulse signal is entirely generated whilst the timing window indication signal is cleared, and the width of such a pulse signal will be insufficient to be detected by the pulse detection circuitry 30. However, in a situation where the pulse signal is generated at least partly whilst the timing window indication signal is set, the pulse control circuitry 35 modifies the behaviour of the pulse generation circuitry 25 such that a wide pulse signal is generated, sufficient to be detected by the pulse detection circuitry 30, and accordingly causing an error signal to be asserted.

In systems where a pulsed clock signal is already present, for example where the storage element is clocked by a pulsed clock signal, the timing window indication signal on path 40 can be derived directly from the pulsed clock signal. However, in embodiments where a non-pulsed clock signal is used, for example a clock signal having a typical 50:50 duty cycle, timing window indication generation circuitry 45 may be provided to effectively encode the timing window indication. In one embodiment, this is done by the use of two versions of the clock signal that are delayed with respect to each other, as will be discussed later for example with reference to FIGS. 9A and 9B. The timing window indication generator 45 may be external to the transition detection circuitry 20, or in one embodiment may be provided within the transition detection circuitry.

Figure 2:
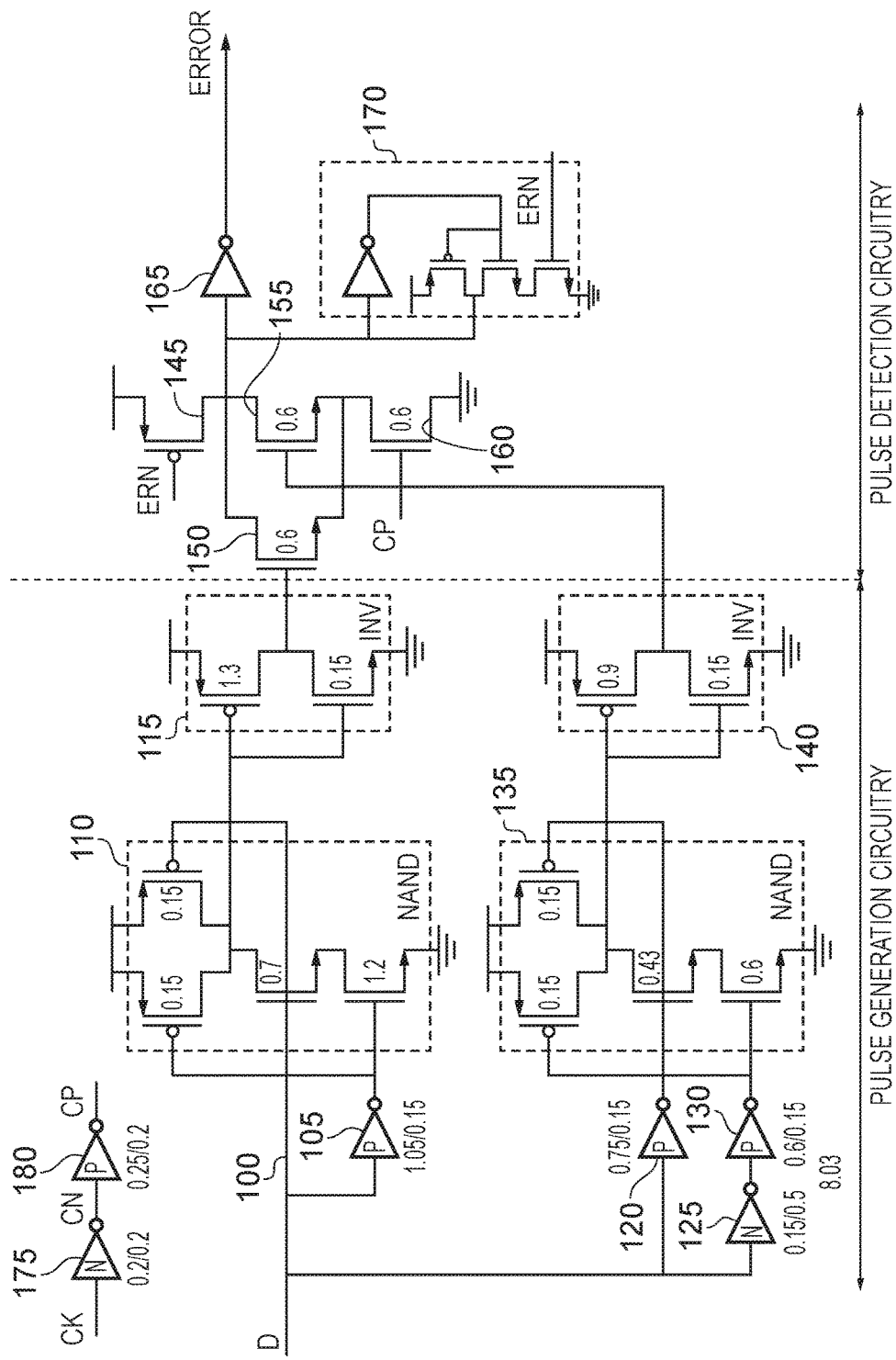
FIG. 2 is a diagram schematically illustrating a reference implementation of a transition detection circuit.

FIG. 2 is a diagram illustrating a reference design of a transition detection circuitry that does not employ the technique described above with reference to FIG. 1. Instead, in accordance with this reference design, the pulse generation circuitry always generates a wide pulse, and the pulse detection circuitry receives information about the timing window indication, so as to suppress generation of the error signal in situations where the pulse received does not overlap with the timing window.

In this example, a pulse clock signal CK is used, and a delayed version of that clock signal CP is created by the two inverters 175, 180. The NAND gate 110 receives the data signal D over path 100 and an inverted version of the data signal from the output of the inverter 105. It will hence be appreciated that the output from the NAND gate 110 will typically be at a logic one level, but for a short period of time following a transition of the input data value from a logic zero level to a logic one level, the output from the NAND gate will be at a logic zero value, hence creating a small logic zero pulse. This will be inverted by the inverter 115 to create a logic one pulse input to the transistor 150, thereby turning on that transistor. The NAND gate 135 and inverter 140 operate in an identical manner to the NAND gate 110 and inverter 115, but due to the presence of the various inverters 120, 125, 130 the NAND gate 135 and inverter 140 generate a pulse in response to a falling edge in the input data signal D. Again, a logic one pulse is generated which turns on the transistor 155.

All of the components within the pulse generation circuitry are sized so as to generate wide pulses at the outputs from the inverters 115, 140. These pulses will be sufficiently wide to fully turn on the transistors 150, 155, and hence allow the input to the inverter 165 to be discharged to a logic zero level through the transistor 160 when the delayed clock signal CP is at a logic one level. Hence, if the pulse is generated during the timing window (at which point the clock signal CP will be high), the input to the inverter 165 is discharged to a logic zero level, hence causing the error signal to be asserted. At the same time, the latch 170 latches that logic zero value, hence ensuring that the error continues to be asserted until the reset signal is asserted. The signal ERN is the inverse of the reset signal, and the reset signal is set at a logic high level for a reset. Accordingly, in the absence of a reset, the ERN signal will be at a logic one level, turning off the transistor 145, and turning on the lower transistor in the latch 170. However, when the reset signal is asserted, the transistor 145 will be turned on, pulling the input of the inverter 165 back to the logic one level, and causing the latch 170 to then latch that logic one level.

Figure 3:
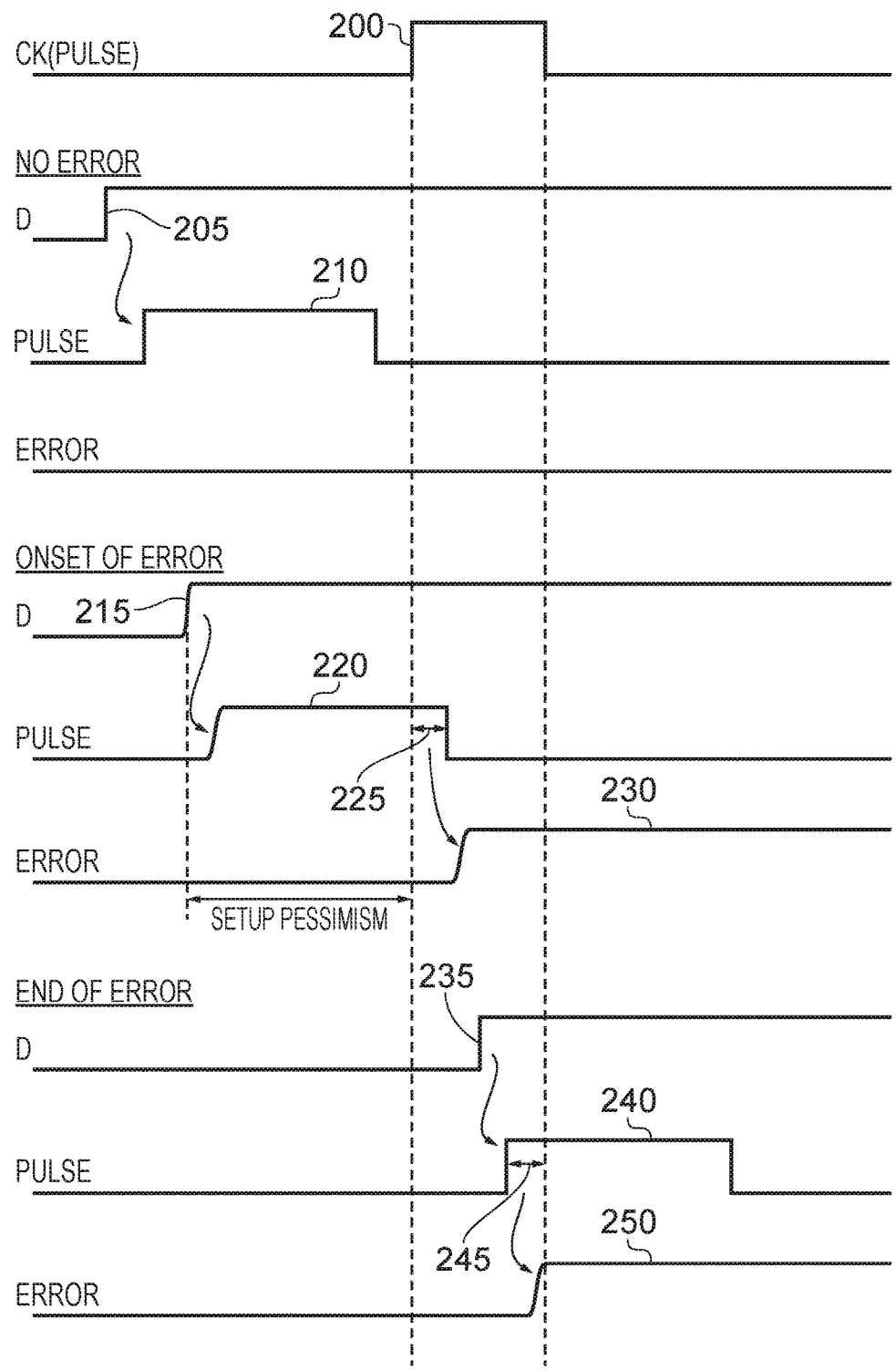
FIG. 3 is a timing diagram illustrating the operation of the circuitry of FIG. 2.

FIG. 3 is a timing diagram illustrating various timings of a transition in the data signal, and an indication as to whether an error signal is generated or not. In the upper example labelled "no error", the transition 205 in the data signal occurs far enough ahead of the rising edge of the clock signal 200 that the subsequent wide pulse 210 is entirely generated outside of the clock pulse window. Accordingly no error is triggered. In the "onset of error" example, the transition 215 in the data signal occurs at a point where the subsequent wide pulse 220 overlaps at least by a minimum amount 225 with the clock pulse. Accordingly, the pulse generated by the pulse generation circuitry triggers the generation of the error signal from the pulse detection circuitry, and accordingly an asserted error 230 is produced. As can be seen, due to the requirement for the pulse generation circuitry to generate pulses wide enough to activate the operation of the pulse detection circuitry, an error is generated even though the transition in the data signal at point 215 is a significant way ahead of the clock pulse, and hence is unlikely in practice to have given rise to any timing error, for example when that data value is subsequently latched by the storage element 15 upon receipt of the clock pulse. This timing pessimism is referred to as the set-up pessimism of the transition detector, and can give rise to a significant number of effectively false error signals being generated.

The "end of error" example in FIG. 3 shows a situation where the data transitions at point 235, giving rise to a pulse 240 that overlaps with the timing window of the clock pulse by at least the minimum amount 245, again causing an error signal 250 to be asserted.

In addition to the set-up pessimism issue shown in FIG. 3, the use of the wide pulses also results in other problems. In particular, whilst the wide pulse is required to ensure that robust error detection can be achieved even under pessimistic PVT variation conditions and when the monitored node glitches, the devices in the pulse generation circuitry need to be relatively wide, high gain devices in order to ensure that the wide pulse is produced. This results in a significant area requirement for the pulse generation circuitry, and also significant energy consumption associated with the pulse generation circuitry (both in terms of leakage power and dynamic power).

Figure 4:
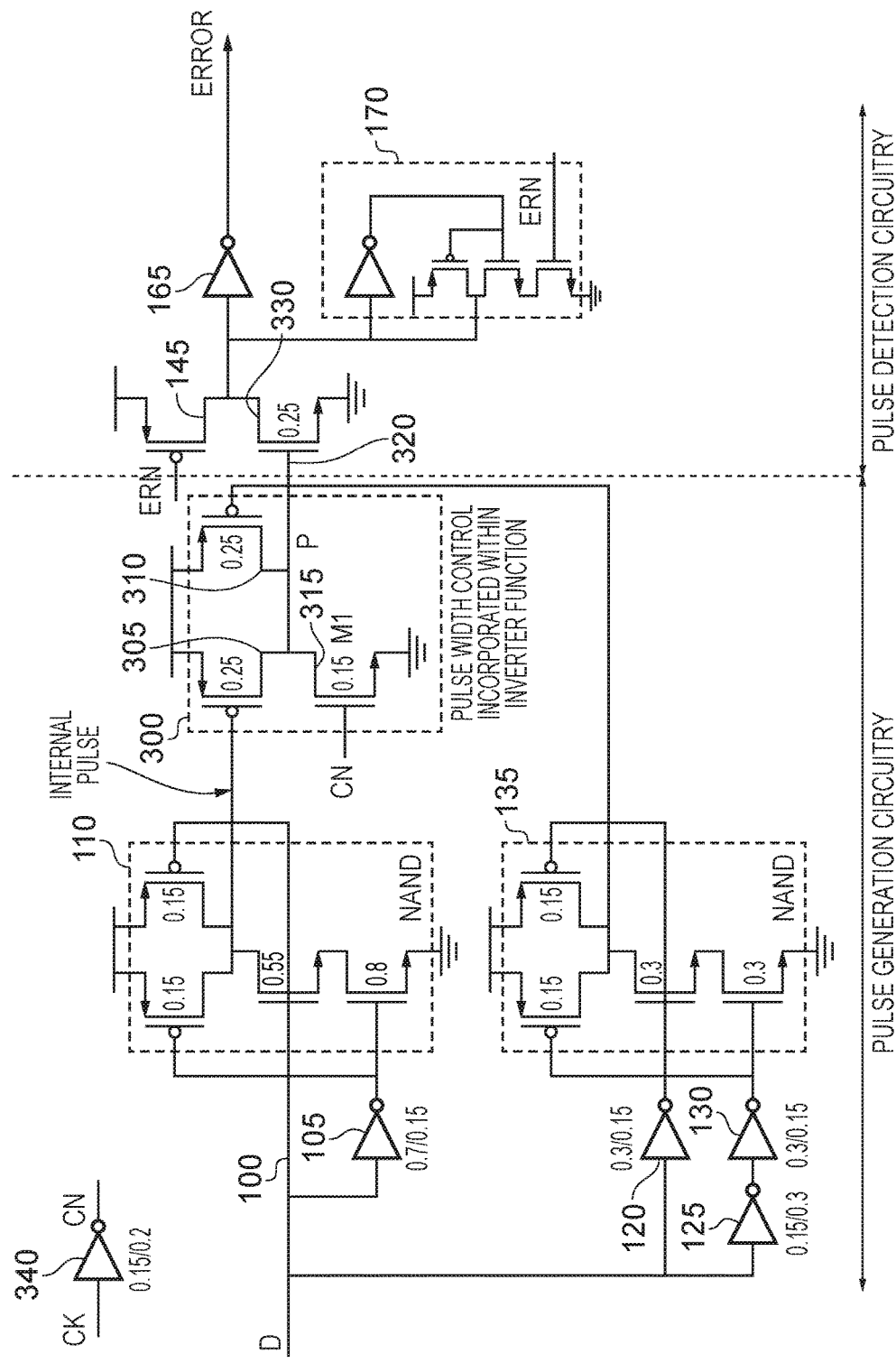
FIG. 4 is a diagram illustrating a transition detection circuit in accordance with one embodiment.

FIG. 4 illustrates one embodiment of the transition detection circuitry 20 of FIG. 1 which alleviates some of the above discussed problems with the reference implementation of FIG. 2. Elements that are common between FIG. 2 and FIG. 4 have been identified with the same reference numerals. However, as will be noted later, the actual sizing of the individual elements can be significantly reduced. By comparison with FIG. 2 and FIG. 4, it will be seen that the two NAND gates 110, 135 are still provided, as are the associated input inverters 105, 120, 125 and 130. However, rather than each NAND gate 110, 135 having an associated inverter, a new circuit block 300 is provided which incorporates pulse width control by virtue of the provision of the pulse control circuitry 315 driven by the inverted clock pulse CN generated by the inverter 340 from the received clock pulse CK. The transistors 305, 310 represent the PMOS devices of the inverters in the reference design of FIG. 2, but the NMOS pull down transistors are replaced by the pulse control circuitry M1 315. When the clock signal CK is low, the input signal CN will be high, hence turning on the transistor 315. If a pulse is generated entirely during this period of time, this equates with a pulse signal being entirely generated outside of the timing window, and hence one for which an error should not be asserted. This functionality occurs by virtue of the fact that the components provided within the pulse generation circuitry are no longer wide, high gain devices, but instead are sized significantly smaller, which, in combination with the transistor M1 315 being turned on, results in only a very small "runt" pulse being generated on path 320, which is insufficient to fully turn on the transistor 330. As a result, no error signal is asserted.

However, if the pulse signal is generated at least partly whilst the timing window indication signal is set (i.e. whilst the inverted clock signal CN is at a logic zero level), then the transistor 315 will be turned off, removing the pull down functionality of the block 300. Accordingly, the falling edge of the internal pulse (the start of the internal pulse) will produce a corresponding rising edge in the output pulse over 320, but the subsequent rising edge of the internal pulse (at the end of the internal pulse) will not trigger a corresponding discharge of the pulse signal 320, and instead the pulse signal will continue to be asserted at the logic one level. Accordingly, the transistor 330 will turn on, discharging the input to the inverter 165 to the logic zero level, causing the error signal to be asserted and a logic zero value to be latched within the latch 170. Only when the clock signal returns to the logic zero level, indicating the end of the timing window, will the inverted clock signal CN then go high, turning back on the transistor 315, and hence causing the pulse to end.

Accordingly, it can be seen that such a design addresses the above area, power and timing overheads of a transition detector of the form shown in FIG. 2 due to it generating wide pulses by discharging the pulsed node through weak leakage currents, instead of relying upon wide devices. This is achieved by turning off the pull down path of the pulse generator during the error detection window. Hence, wide pulses are generated as required in order to ensure robust error detection is achieved, but without the energy and area overheads of the prior art, and without the set-up pessimism issues discussed earlier with reference to FIG. 3.

Figure 5A:
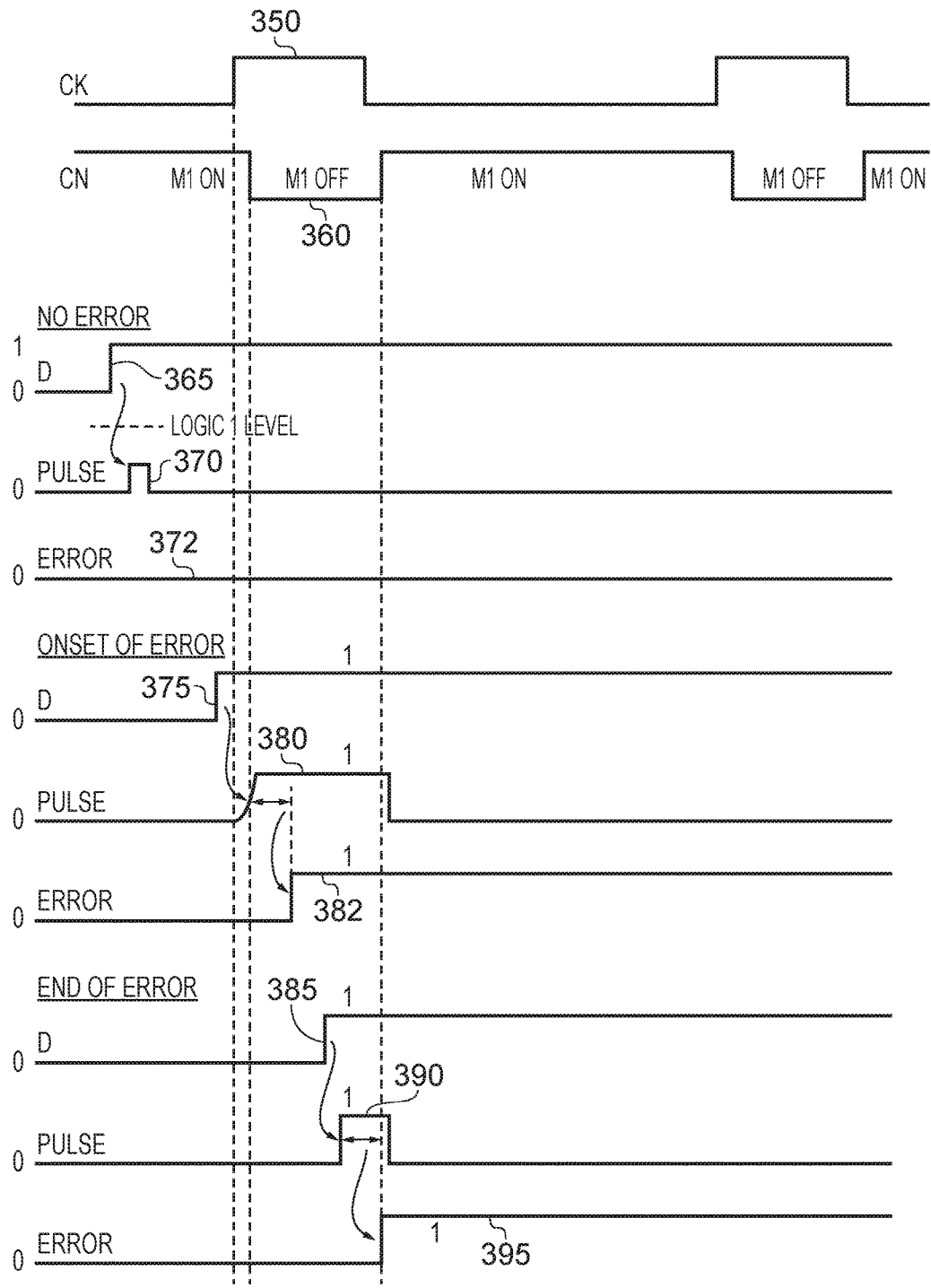
FIGS. 5A and 5B are timing diagrams illustrating the operation of the circuitry of FIG. 4 in accordance with one embodiment.

FIG. 5A illustrates a timing diagram for the circuitry of FIG. 4. As can be seen, shortly after each clock pulse 350, the inverted clock signal CN creates a corresponding logic zero pulse 360. The "no error" condition is shown first, where a transition 365 in the input signal results in a small pulse signal 370 being generated by the relatively small sized components within the pulse generation circuitry. In one embodiment, the pulse signal is so short that it does not even reach the logic one level, and accordingly may be referred to as a runt pulse. The pulse is insufficient to turn on the transistor 330, and accordingly no error signal is asserted on path 372.

The "onset of error" condition occurs when the transition 375 in the input signal occurs very close to the start of the timing window, resulting in the generation of a pulse which is still in the process of being generated when the transistor M1 315 turns off. As a result, a wide pulse 380 is generated and once the pulse has been active for a predetermined minimum amount of time, this causes an error signal to be asserted as shown by signal 382. By comparison with the onset of error illustration of FIG. 3, it will be seen that the set-up pessimism is effectively removed, hence avoiding the generation of false error signals.

The "end of error" illustration of FIG. 5A shows a transition 385 in the input data signal giving rise to the pulse 390. The pulse ends when the transistor M1 315 is turned back on, but will have been active for a sufficient amount of time for the transistor 330 to have discharged the input of the inverter 165, and accordingly for the error signal to be asserted, as shown by the signal line 395.

Figure 5B:
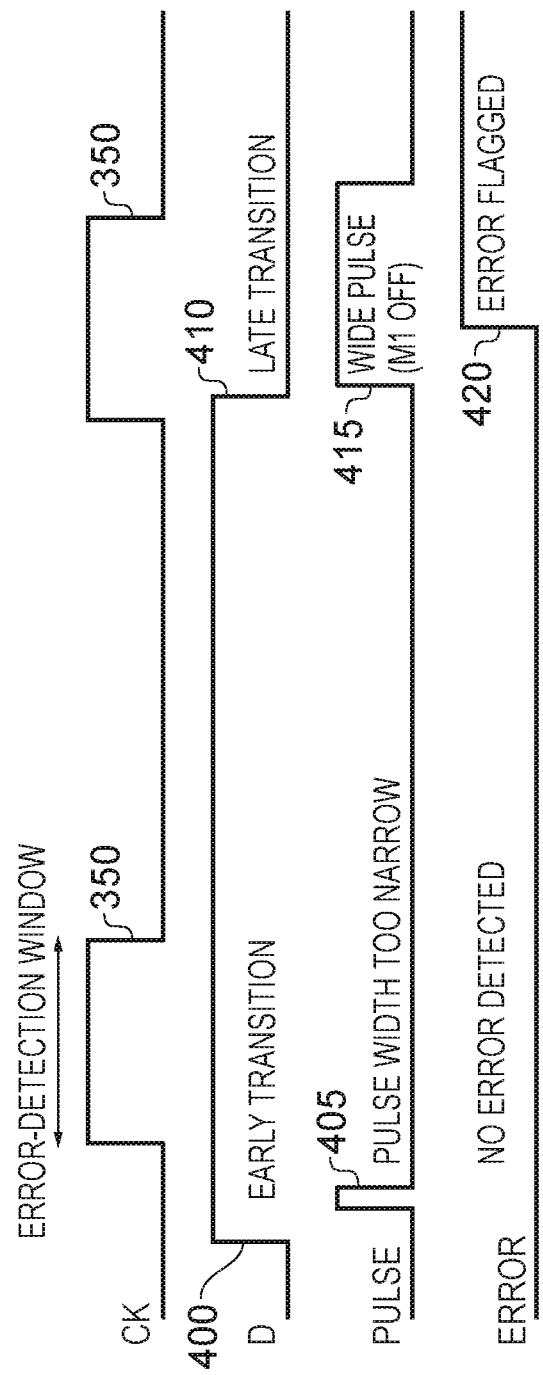

The transition detection circuitry of FIG. 4 can be referred to as a modal transition detector, since the pulse width generated by the pulse generator within the transition detection circuitry differs depending on whether the transition occurs within the timing window (also referred to herein as the error detection window) or outside of it. In particular, when the transition occurs within the error detection window or just prior to it, a wide pulse width is generated for robust error detection, and accordingly the modal transition detector can be considered to be operated in a "detection mode". However, in all other instances, only a narrow pulse width is generated, which is insufficient to trigger the pulse detection circuitry to detect the error, at which point the transition detector can be said to be operating in a "benign mode". These two different modes are illustrated in FIG. 5B. The benign mode is shown first, where the transition 400 in the input data gives rise to a runt pulse 405 that occurs entirely outside of the error detection window 350, hence resulting in no error being detected. The detection mode is shown in the right hand side of the figure, where a late transition 410 in the input signal gives rise to a wide pulse 415, causing an error signal to be asserted at point 420.

In the benign mode, the weak drive strength of the NAND gates combined with the actively driven transistor M1 315 causes the total pulse width of the pulse to degenerate into a runt pulse. Whilst during this time a contention path exists since both the pull-up and pull-down devices are active at the same time, because the NAND gates are deliberately downsized in the design, the actual contention duration is equal to the duration of the runt pulse and therefore very small.

During the detection mode, it will be appreciated that the pulse signal output from the block 300 is left floating for a small duration of time when the pulse is high. However, in most designs, the error detection window is necessarily small (typically approximately a third of the clock cycle so approximately 200 to 300 ps for a 1 GHz clock). Use of the pulsed clock removes any dependence on the minimum frequency of operation.

If required, various layout precautions can be taken in order to minimise any parasitic coupling capacitance to the pulse path 320. For example, the pulse path can be laid out with double spacing from its nearest neighbours in order to reduce coupling due to co-planar nets in the same metal layer. Alternatively, a ground shield in a metal 2 layer can be routed on top of the pulse path 320 to prevent the automatic place and route tool from routing signals above the sensitive node. Whilst such layout precautions will add some area penalty, this area penalty is due entirely to additional spacing requirements, and does not incur any power consumption overheads, in contrast to the requirement to use wide, high-gain devices as in the reference design of FIG. 2.

FIG. 6 is a table contrasting various properties of the design of FIG. 4 against the reference design of FIG. 2. As can be seen, the potential area, power and energy savings that can be achieved using the design of FIG. 4 are significant. With regards to the total transistor width in the pulse generators, it can be seen that there is an overall saving of almost 50%. An important criteria for low power consumption is the total transistor width that switches when the clock signal CK transitions. In the proposed design of FIG. 4, there is a 65% reduction in the total capacitance on the clock path. This is reflected in the energy consumption per cycle when the data input D remains static whilst the clock pin transitions. In particular, as shown in FIG. 6 there is a 76.5% energy saving in such situations. In situations where the data input also switches, there is still an energy saving of 45.4%.

Figure 7:
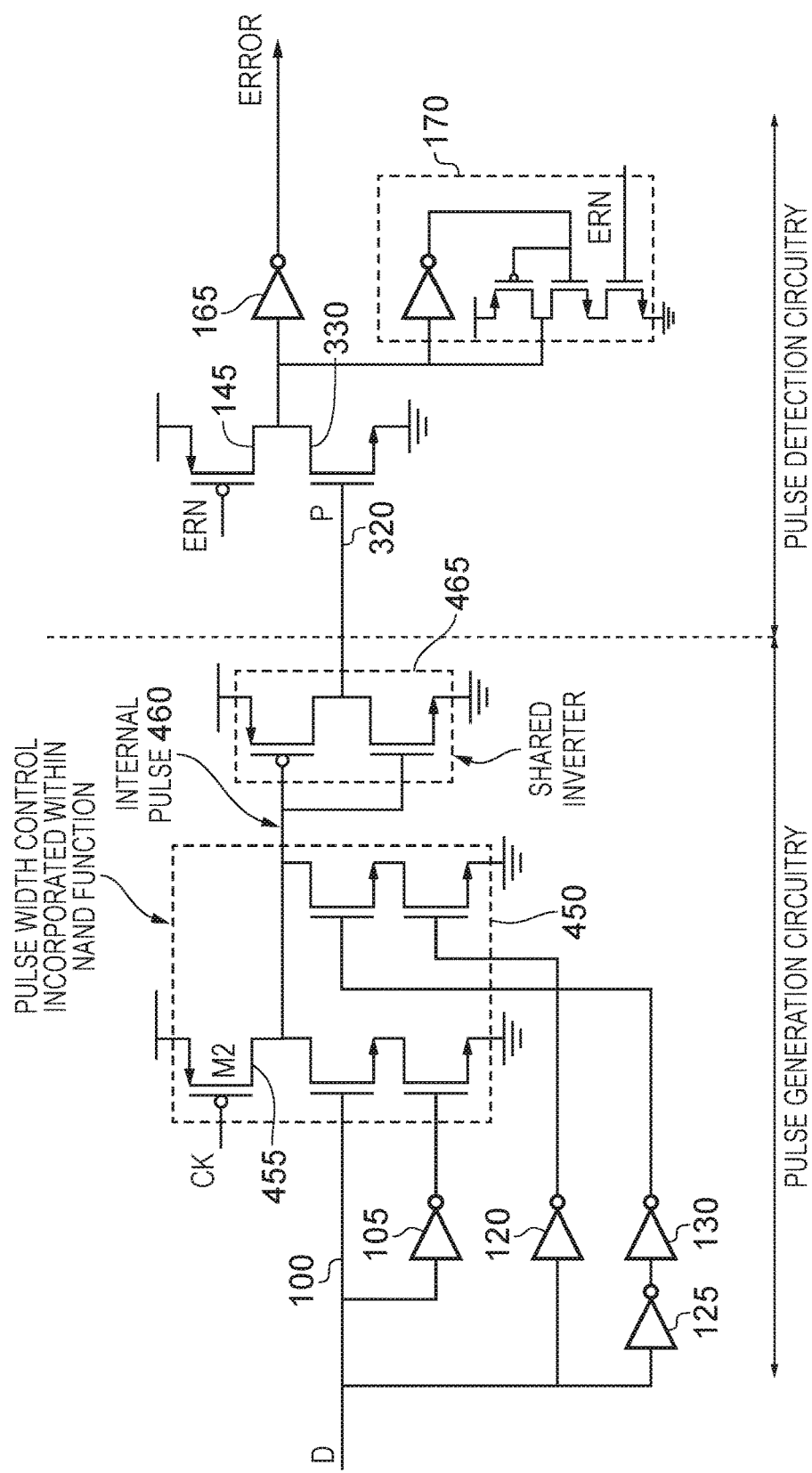
FIG. 7 is a diagram illustrating transition detection circuitry in accordance with an alternative embodiment.

In the example of FIG. 4, the pulse control circuitry is incorporated within the inverter stage 300 used to generate the output pulse from the internally generated pulse output by the NAND gates 110, 135. In an alternative embodiment as shown in FIG. 7, the pulse control circuitry can instead be introduced at an earlier stage in the pulse generator circuitry, by incorporating the functionality within the NAND gate functionality. In particular, as shown in FIG. 7, rather than two separate NAND gates, a single combined block 450 is provided. This retains the NMOS pull-down components from both NAND gates 110, 135, but replaces the pull-up PMOS components with the device M2 455, which is connected to the clock pulse CK. Hence, when the clock signal is low (indicating that operation is taking place outside of the timing window), the device 455 is on, allowing pull-up functionality. However, when the clock signal is high, indicating the presence of the timing window, then the device 455 is turned off, disabling the pull-up functionality. As a result, when the pulse is generated entirely outside of the timing window, a small runt internal pulse is generated at point 460 in response to either a rising or falling transition in the data signal, resulting in a small runt pulse over path 320 output from the inverter 465. As a result, the error is not detected and no error signal is asserted by the pulse detection circuitry. In contrast, if the pulse signal is generated at least partly whilst the timing window indication signal is set, and accordingly the device 455 is turned off, then the internal pulse stays low until the end of the clock pulse CK, extending the width of the internal pulse, and accordingly extending the width of the logic one pulse output over path 320. As a result, the transistor 330 discharges, giving rise to an asserted error signal and the latching of a logic zero within the latch 170. It can be seen that such a design significantly reduces the overall number of components required. Further, as discussed earlier, the components in the pulse generation circuitry can be made significantly smaller than required in the reference design of FIG. 2.

Figure 8A:
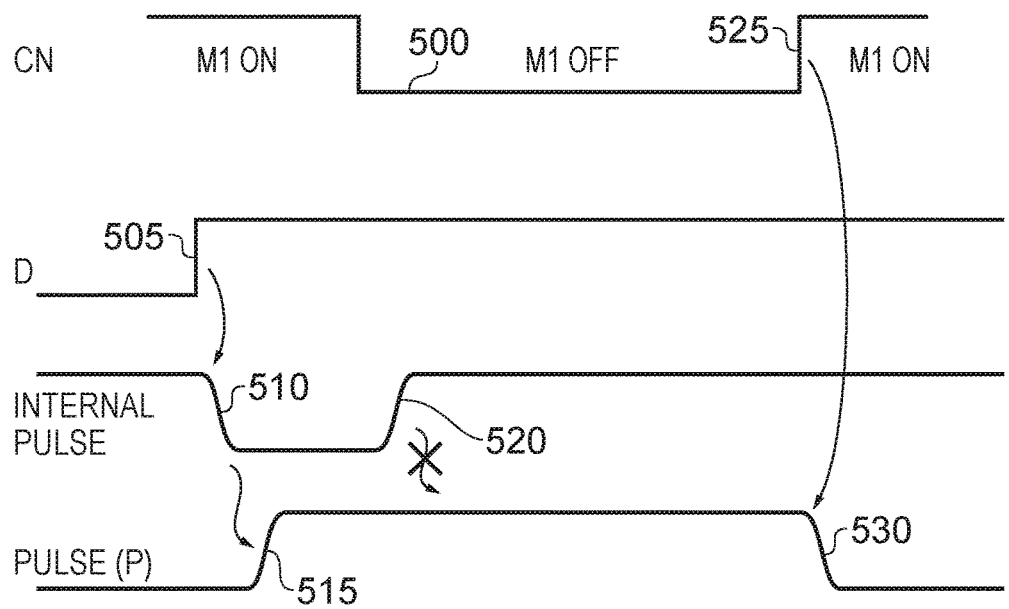
FIGS. 8A and 8B are timing diagrams illustrating the differences in operation between the embodiment of FIG. 4 and the embodiment of FIG. 7.
Figure 8B:
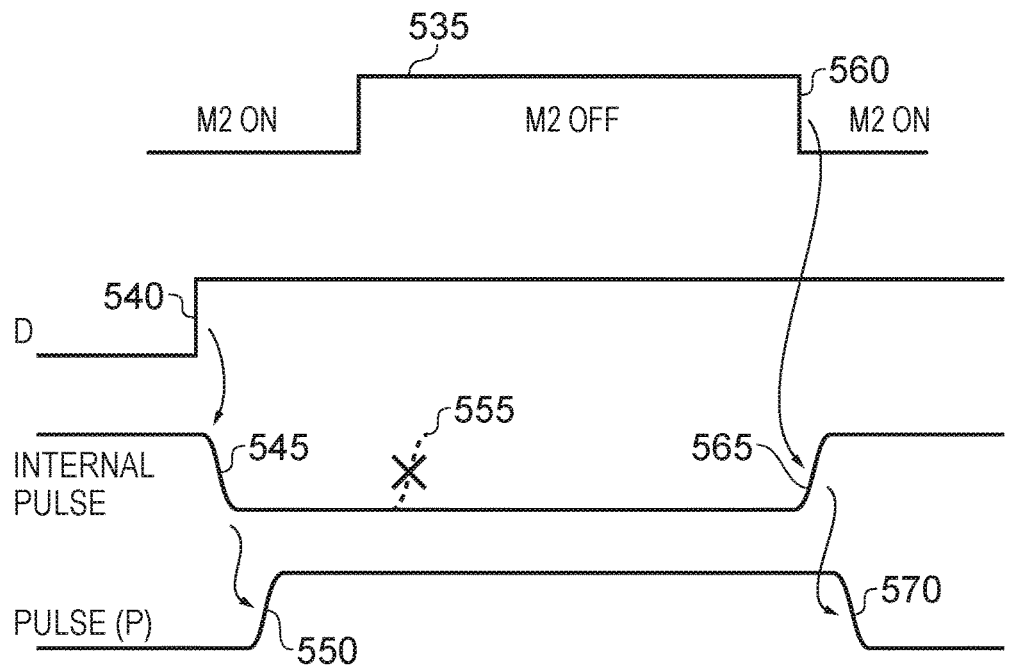

FIGS. 8A and 8B are timing diagrams illustrating the differences between the operation of the circuitry of FIG. 4 and the circuitry of FIG. 7, both resulting in the same form of pulse signal being generated. Considering first FIG. 8A, which illustrates the mechanism employed in FIG. 4, a transition 505 in the data signal causes an internal pulse to be generated at point 510. The internal pulse subsequently ends at point 520. However, since at this point the clock signal CN is at logic low level, turning off the transistor 315, there is no corresponding change in the pulse P. Hence, whilst the rising edge of the pulse 515 is driven from the falling edge of the internal pulse 510, the falling edge of the pulse 530 is subsequently driven of the rising edge 525 of the clock signal CN. As a result, a wide pulse is generated, causing the pulse detection circuitry to detect the pulse and assert the error signal.

FIG. 8B illustrates the operation of the circuitry of FIG. 7. As shown, a transition 540 in the input signal gives rise to a falling transition 545 indicating the start of the internal pulse. However, at the time 555 where the internal pulse would normally have ended, the clock signal 535 is at logic one level, turning off the transistor M2 455. As a result, the pull-up functionality is disabled, and the pulse P triggered at point 550 off the falling transition of the internal pulse 545 stays asserted until the falling edge 560 of the clock signal CK causes the positive transition in the internal pulse at point 565, which in turn causes the falling edge of the pulse P at point 570. Again, a wide pulse is generated which is then detected by the pulse detection circuitry and causes the error to be asserted.

In the examples of FIGS. 4 and 7, it is assumed that a pulsed clock input CK is provided. If instead the clock input is a standard 50:50 duty cycle clock signal, then timing window indication generation circuitry 45 shown in FIG. 1 can be used to generate the required signals to effectively encode the timing window indication signal. FIG. 9A is an embodiment corresponding to FIG. 4, but where such a standard clock signal is used. The timing window indication generator 45 takes the form of the chain of inverters 610, 615, 620, 625. The circuitry of FIG. 9A is essentially the same as FIG. 4, but with the exception that the transistor M1 315 of FIG. 4 is replaced with the two NMOS transistors 600, 605 in FIG. 9A driven by the clock signals CN and CPd, respectively. The clock signals CN and CPd are inverted versions of one another, and accordingly for much of the time one of those two transistors will be turned on, providing the pull-down functionality. However, following the rising edge of the clock signal there will be a small period of time where both transistors 600, 605 are turned off, effectively encoding the timing window during which the pull-down functionality is disabled.

Figure 9B:
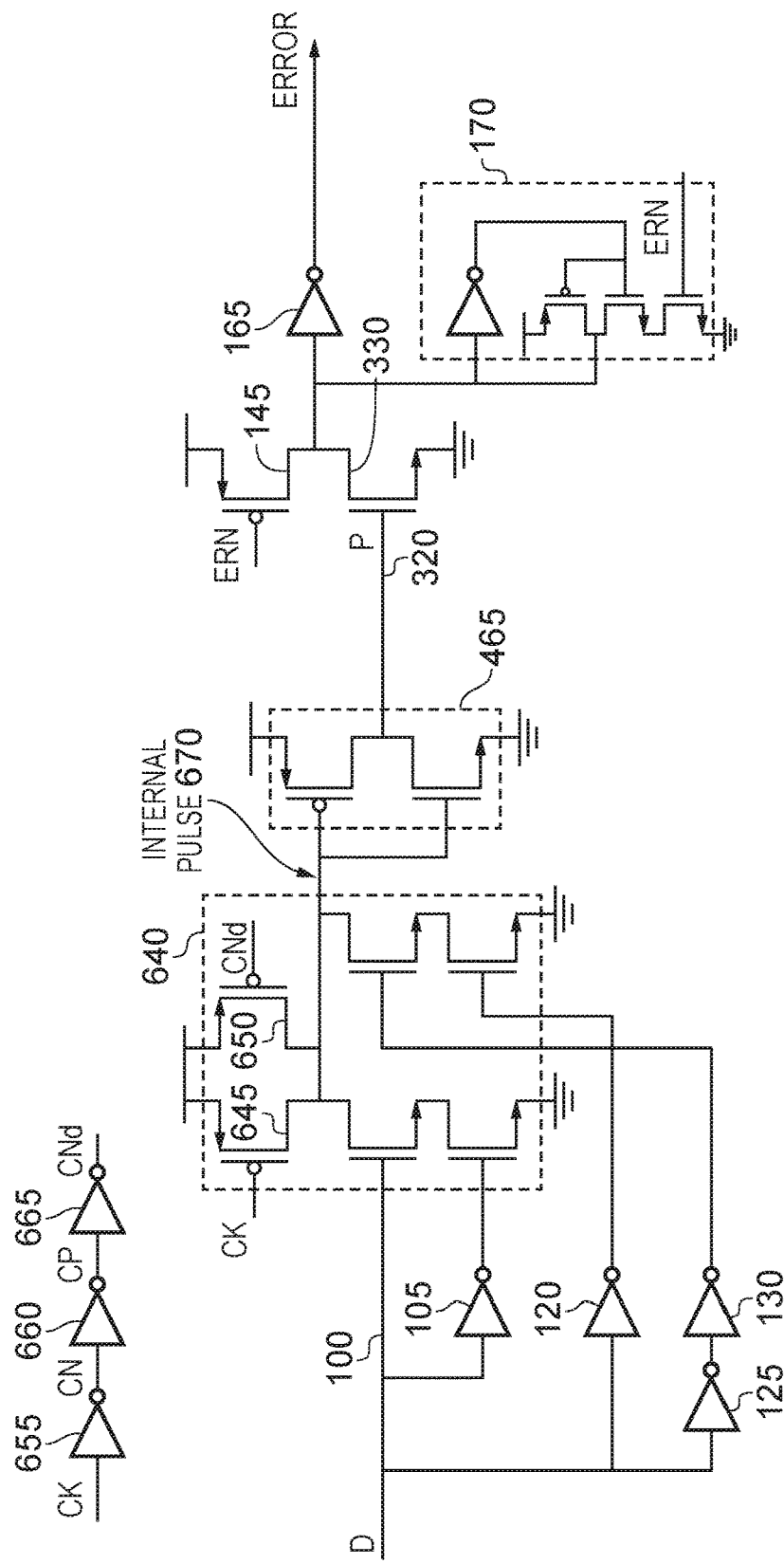
FIG. 9B is a diagram of transition detection circuitry in accordance with an alternative embodiment to that discussed earlier with reference to FIG. 7.

FIG. 9B illustrates a corresponding modification to the embodiment of FIG. 7, where the transistor M2 455 is replaced with the two transistors 645, 650. The timing window indication generator 45 takes the form of the three inverters 655, 660, 665. The two transistors 645, 650 receive the clock signals CK and CNd respectively, which for most of the time are inverted versions of each other. As a result, for most of the time one of the two transistors will be turned on, enabling the pull-up functionality. However, for a short period of time following the rising edge of the clock, both transistors 645, 650 will be turned off, hence disabling the pull-up functionality during the required timing window.

Figure 10A:
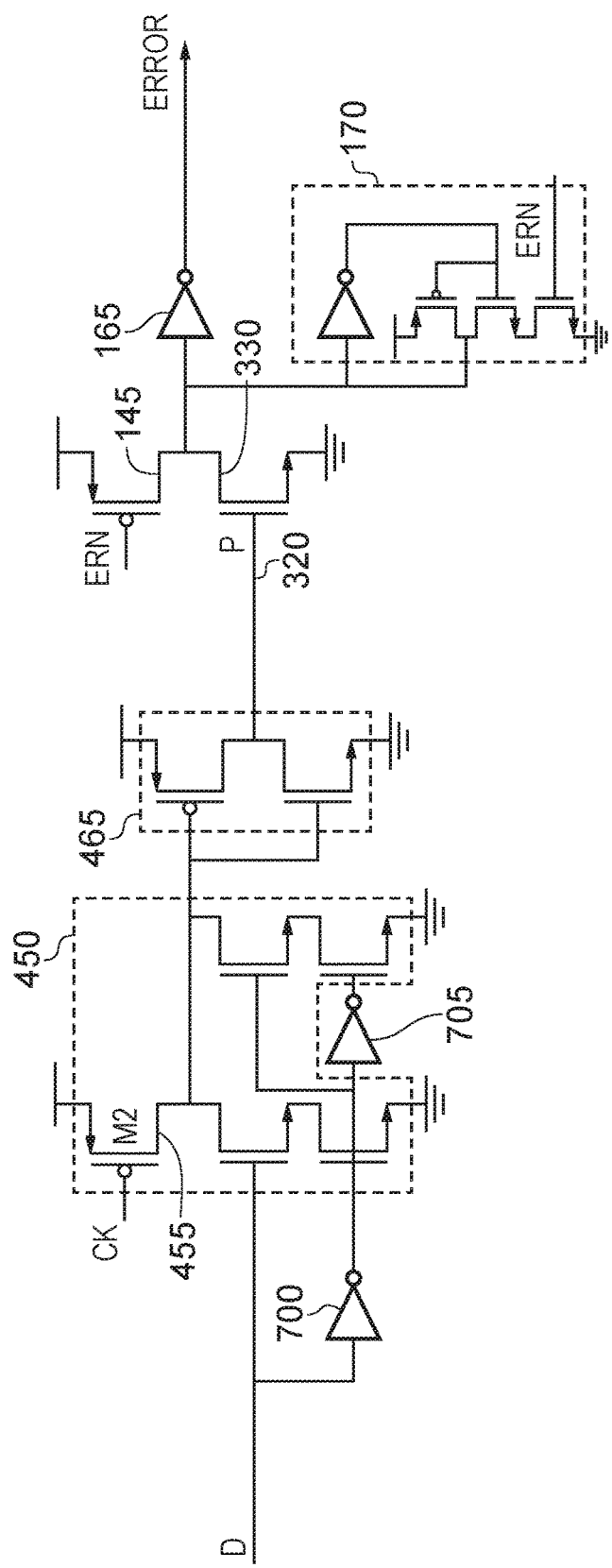
FIGS. 10A and 10B are diagrams of transition detection circuitry in accordance with yet further alternative embodiments to that discussed earlier with reference to FIG. 7.

Various modifications can be made to the above described embodiments whilst still achieving the same functionality. For example, it is possible to reduce the number of inverters used to create the inputs to the components providing the NAND gate functionality within the pulse generation circuitry. This is shown by way of example in FIG. 10A, which shows a variant of the FIG. 7 embodiment where the inverters 105, 120, 125, 130 of FIG. 7 are replaced with the inverters 700 and 705.

Figure 10B:
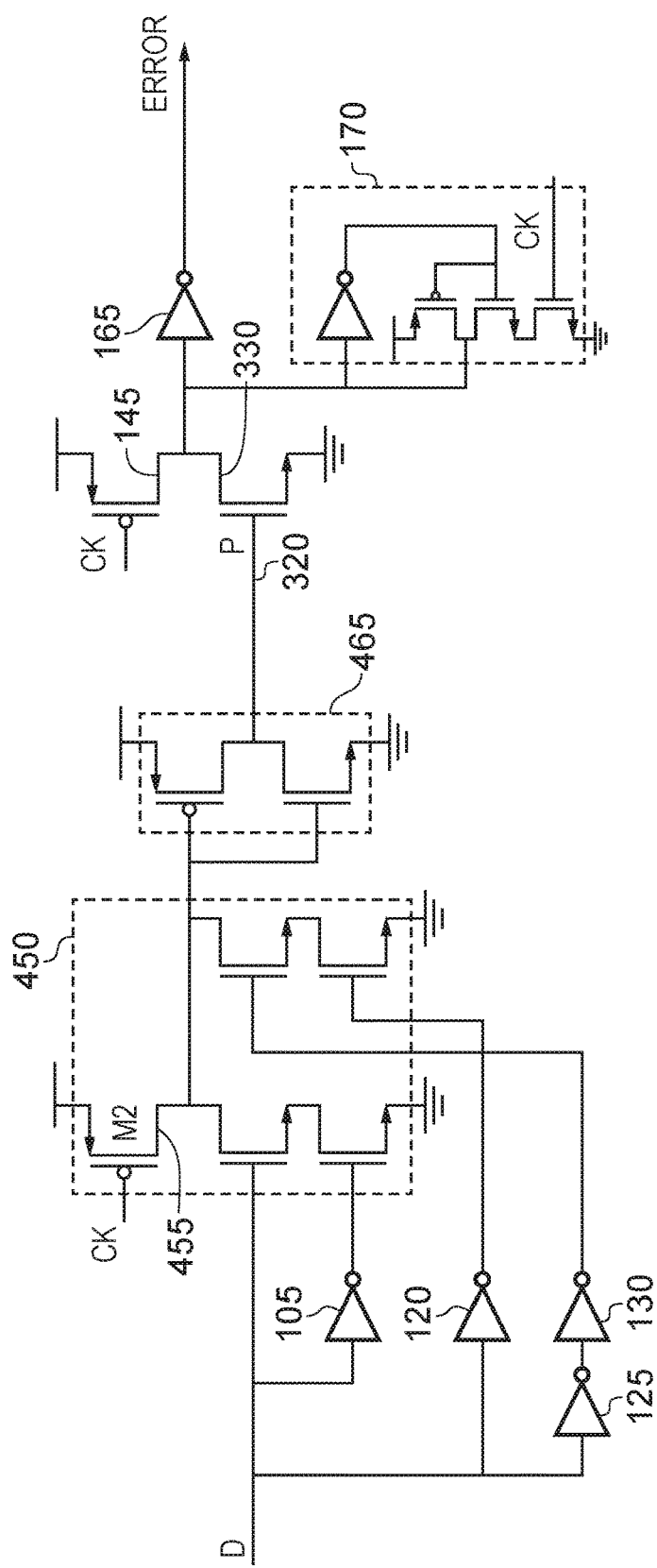

As another example, in an alternative embodiment the ERN signal can be replaced with the clock signal. This is shown by way of example in FIG. 10B, which shows a variant of the FIG. 7 embodiment where the ERN input to the transistor 145 and to the bottom transistor in the latch 170 is replaced with the clock signal CK. As a result of this change, the error signal becomes a pulsed signal, that could then for example be latched within the system control circuitry 55 shown in FIG. 1.

From the above described embodiments, it will be seen that such embodiments enable a transition detector to be provided that ensures robust error detection can be achieved, but with significantly reduced area and power consumption requirements when compared with the reference design of FIG. 2. The design can also effectively remove the set-up pessimism issues with the reference design.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. Transition detection circuitry comprising:
    pulse generation circuitry to receive an input signal and to generate a pulse signal in response to a transition in the input signal; and
    pulse detection circuitry to assert an error signal on detection of the pulse signal generated by the pulse generation circuitry;
    the pulse generation circuitry having pulse control circuitry to control a property of the pulse signal dependent on a timing window indication signal;
    the pulse control circuitry being arranged, when the pulse signal is generated at least partly while the timing window indication signal is set, to control the property of the pulse signal such that the pulse signal generated by the pulse generation circuitry is detected by the pulse detection circuitry; and
    the pulse control circuitry being arranged, when the pulse signal is entirely generated while the timing window indication signal is cleared, to control the property of the pulse signal such that the pulse signal generated by the pulse generation circuitry is undetected by the pulse detection circuitry;
    wherein the pulse control circuitry comprises transistor circuitry forming one of a pull-down path and a pull-up path within the pulse generation circuitry, the pulse control circuitry being turned off while the timing window indication signal is set.

2. Transition detection circuitry as claimed in claim 1, wherein:
    the property of the pulse signal controlled by the pulse control circuitry is a pulse width of the pulse signal;
    the pulse control circuitry being arranged, when the pulse signal is generated at least partly while the timing window indication signal is set, to control the pulse width such that the pulse signal is generated with the pulse width sufficient to cause the pulse detection circuitry to detect the pulse signal; and
    the pulse control circuitry being arranged, when the pulse signal is entirely generated while the timing window indication signal is cleared, to control the pulse width such that the pulse signal is generated with the pulse width insufficient to cause the pulse detection circuitry to detect the pulse signal.

3. Transition detection circuitry as claimed in claim 2, wherein the pulse generation circuitry comprises:
    internal pulse signal generation circuitry to generate an internal pulse signal in response to the transition in the input signal; and
    output circuitry to generate, in dependence on the internal pulse signal, the pulse signal output to the pulse detection circuitry; and
    the pulse control circuitry being incorporated within one of the internal pulse signal generation circuitry and the output circuitry.

4. Transition detection circuitry as claimed in claim 3, wherein:
    the pulse control circuitry is incorporated within the output circuitry;
    the internal pulse signal is such that, when the property of the pulse signal is determined from the corresponding property of the internal pulse signal, the pulse signal generated by the pulse generation circuitry is undetected by the pulse detection circuitry;
    the pulse control circuitry is responsive to the pulse signal being generated at least partly while the timing window indication signal is set, to modify the property of the pulse signal relative to the corresponding property of the internal pulse signal, in order to ensure that the pulse signal generated by the output circuitry is detected by the pulse detection circuitry.

5. Transition detection circuitry as claimed in claim 4, wherein the pulse control circuitry is responsive to the pulse signal being generated at least partly while the timing window indication signal is set, to increase the pulse width of the pulse signal relative to the corresponding pulse width of the internal pulse signal.

6. Transition detection circuitry as claimed in claim 5, wherein:
    the pulse signal generated by the output circuitry has a starting edge triggered by a corresponding starting edge of the internal pulse signal;
    the pulse control circuitry is responsive to the pulse signal being entirely generated while the timing window indication signal is cleared, to trigger generation of an ending edge of the pulse signal from a corresponding ending edge of the internal pulse signal; and
    the pulse control circuitry is responsive to the pulse signal being generated at least partly while the timing window indication signal is set, to instead trigger generation of the ending edge of the pulse signal when the timing window indication signal is no longer set.

7. Transition detection circuitry as claimed in claim 3, wherein:
    the pulse control circuitry is incorporated within the internal pulse signal generation circuitry;
    the output circuitry is arranged to determine the property of the pulse signal from the corresponding property of the internal pulse signal; and
    the pulse control circuitry is responsive to the pulse signal being generated at least partly while the timing window indication signal is set, to modify the corresponding property of the internal pulse signal in order to ensure that the pulse signal generated by the output circuitry is detected by the pulse detection circuitry.

8. Transition detection circuitry as claimed in claim 7, wherein the pulse control circuitry is responsive to the pulse signal being generated at least partly while the timing window indication signal is set, to increase a pulse width of the internal pulse signal relative to a default pulse width of the internal pulse signal.

9. Transition detection circuitry as claimed in claim 8, wherein:
the pulse signal generated by the output circuitry has a starting edge triggered by a corresponding starting edge of the internal pulse signal and an ending edge triggered by a corresponding ending edge of the internal pulse signal; and
the pulse control circuitry is responsive to the pulse signal being generated at least partly while the timing window indication signal is set, to defer generation of the corresponding ending edge of the internal pulse signal until the timing window indication signal is no longer set.

10. Transition detection circuitry as claimed in claim 1, wherein the timing window indication signal is derived from a clock pulse signal.

11. Transition detection circuitry as claimed in claim 1, further comprising timing window indication generation circuitry to generate multiple signals from which the timing window indication signal is derived.

12. Transition detection circuitry as claimed in claim 1, wherein the pulse detection circuitry is arranged, once the pulse signal generated by the pulse generation circuitry has been detected, to continue to assert the error signal until a reset signal is received.

13. A data processing apparatus comprising:
processing circuitry to perform data processing operations; and
transition detection circuitry as claimed in claim 1, arranged to receive, as the input signal, a data signal generated by the processing circuitry.

14. A data processing apparatus as claimed in claim 13, further comprising:
control circuitry responsive to assertion of the error signal from the transition detection circuitry, to perform a predetermined operation.

15. A method of generating an error signal indicating detection of a transition in an input signal occurring within a timing window, comprising:
generating, by pulse generation circuitry, a pulse signal in response to a transition in the input signal;
asserting an error signal on detection of the pulse signal;
controlling, by pulse control circuitry, a property of the pulse signal dependent on a timing window indication signal;
when the pulse signal is generated at least partly while the timing window indication signal is set, controlling the property of the pulse signal such that the pulse signal is detected; and
when the pulse signal is entirely generated while the timing window indication signal is cleared, controlling the property of the pulse signal such that the pulse signal is undetected;
wherein the pulse control circuitry comprises transistor circuitry forming one of a pull-down path and a pull-up path within the pulse generation circuitry, the pulse control circuitry being turned off while the timing window indication signal is set.

16. Transition detection circuitry comprising:
pulse generation means for receiving an input signal and for generating a pulse signal in response to a transition in the input signal; and
pulse detection means for asserting an error signal on detection of the pulse signal generated by the pulse generation means;
the pulse generation means having pulse control means for controlling a property of the pulse signal dependent on a timing window indication signal;
the pulse control means, when the pulse signal is generated at least partly while the timing window indication signal is set, for controlling the property of the pulse signal such that the pulse signal generated by the pulse generation means is detected by the pulse detection means; and
the pulse control means, when the pulse signal is entirely generated while the timing window indication signal is cleared, for controlling the property of the pulse signal such that the pulse signal generated by the pulse generation means is undetected by the pulse detection means;
wherein the pulse control means comprises transistor circuitry forming one of a pull-down path and a pull-up path within the pulse generation means, the pulse control means being turned off while the timing window indication signal is set.

* * * * *